United States Patent
Fuselier et al.

(10) Patent No.: US 6,570,228 B1
(45) Date of Patent: May 27, 2003

(54) METHOD AND APPARATUS FOR ELECTRICALLY MEASURING INSULATING FILM THICKNESS

(75) Inventors: Mark Brandon Fuselier, Austin, TX (US); Roger Thomas Williams, Galveston, TX (US); Michael Verne Fenske, Round Rock, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 16 days.

(21) Appl. No.: 10/052,060

(22) Filed: Jan. 17, 2002

(51) Int. Cl.$^7$ .................................. H01L 21/8238
(52) U.S. Cl. ..................... 257/368; 438/199; 438/17
(58) Field of Search ...................... 257/368; 324/64; 437/44; 438/17, 248, 199

(56) References Cited

U.S. PATENT DOCUMENTS

| | | | | |
|---|---|---|---|---|
| 4,347,479 A | * | 8/1982 | Cullet | .......................... 324/64 |
| 5,010,029 A | * | 4/1991 | Liu et al. | ....................... 437/44 |
| 6,204,073 B1 | * | 3/2001 | Nandakumar et al. | ......... 438/17 |
| 6,291,254 B1 | * | 9/2001 | Chou et al. | .................... 438/17 |

* cited by examiner

Primary Examiner—David Nelms
Assistant Examiner—Thinh T. Nguyen
(74) Attorney, Agent, or Firm—Williams, Morgan & Amerson

(57) ABSTRACT

A method and an apparatus for measuring insulating film thickness, such as the width of sidewall spacers. The method includes positioning a first test structure having a first resistance at a first location on a semiconductor wafer and positioning a second test structure having a second resistance different from the first resistance at a second location on the semiconductor wafer. The method also includes measuring the first resistance of the first test structure and measuring the second resistance of the second test structure. The method also includes determining an average characteristic of the first test structure and the second test structure, other than resistance, based on the first resistance of the first test structure and the second resistance of the second test structure.

68 Claims, 6 Drawing Sheets

METHOD AND APPARATUS FOR ELECTRICALLY MEASURING INSULATING FILM THICKNESS

BACKGROUND OF THE INVENTION

1. Field of the Invention

This invention relates generally to semiconductor manufacturing, and, more particularly, to a method and apparatus for electrically measuring insulating film thickness, such as the width of sidewall spacers.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using a semiconductor-manufacturing tool called an exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another. The manufacturing tools communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical wafer 100 comprising a semiconductor 105. The wafer 100 typically includes a plurality of individual semiconductor die 150 arranged in a grid, with spaces, called scribe lines 155 between individual ones of the semiconductor die 150. Photolithography steps are typically performed by a stepper on approximately one to four die locations at a time, depending on the specific photomask employed. Photolithography steps are generally performed to form patterned layers of photoresist above one or more process layers that are to be patterned. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features, such as a polysilicon line, or opening-type features, that are to be replicated in an underlying process layer. The wafer 100 may typically have one or more indicia for alignment purposes, such as a notch 110 and/or registration marks 115.

Turning now to FIG. 2A, various features 200A that may be associated with any one of the semiconductor die 150 are shown. As noted above, the fabrication stages may include doping a source region 205 and a drain region 210 in a semiconductor substrate of the wafer 100. A gate region 220 may also be created on or in the semiconductor substrate. The gate region 220 has associated with it a length ($L_{GATE}$) 225. Also associated with the gate region 220 is an effective gate length ($L_{EFF}$) 230. The effective gate length 230 corresponds to the distance between the source region 205 and the drain region 210 in which the gate region 220 is present.

Using the features 200A and associated characteristics of FIG. 2A, optimizations designed to increase circuit speed are discussed. Three parameters for circuit speed are the gate capacitance, the transistor drive current, and the transistor leakage current. The gate capacitance is proportional to the gate length 225. That is, for a larger gate length 225 the gate capacitance is higher. The transistor drive current is inversely proportional to the effective gate length 230. That is, for a smaller effective gate length 230 the transistor drive current is higher. The transistor leakage current is also inversely proportional to the effective gate length 230. That is, for a smaller effective gate length 230 the transistor leakage current is higher. While a larger transistor drive current may be preferred, a smaller transistor leakage current is preferred.

The delay, τ, for a given transistor must be low for the overall circuit speed to be optimized. The delay is proportional to the gate capacitance (C) and the gate voltage (V) and inversely proportional to the drive current ($I_{drive}$).

$$\tau = \frac{CV}{I_{drive}}$$

Optimizing for circuit speed calls for controlling the effective gate length 230 while making the gate length 225 small. As a smaller gate length 225 leads to a smaller gate capacitance, for the same drive current, the delay is low. The semiconductor industry has looked for ways to accomplish this goal.

Turning to FIG. 2B, one way to achieve the goal above is to use sidewall spacers 250, a type of insulating film, in an attempt to limit leakage current. Various improved features 200B that may be associated with any one of the semiconductor die 150 are shown. As noted above, the fabrication stages may include doping the source region, shown as a source region 205A before the sidewall spacers are formed and a source region 205B after the sidewall spacers are formed. Likewise, the fabrication stages may include doping the drain region, shown as a drain region 210A before the sidewall spacers are formed and doping a drain region 210B after the sidewall spacers are formed. The gate region 220 is also shown with its associated length ($L_{GATE}$) 225. Also associated with the gate region 220 are an old effective gate length 230A before the sidewall spacers and a new effective gate length 230B after the sidewall spacers.

The sidewall spacers 250 provide an increased effective gate length 230 for a given gate length 225. Put another way, for an effective gate length 230, the given gate length 225 can be made smaller. When using sidewall spacers 250, the width of the sidewall spacers 250 must be monitored closely if the performance of the finished circuit is to be predicted with any confidence. One aspect of the present invention is directed to monitoring the width of insulating films, at least in part, using the sidewall spacers as an illustrative example.

SUMMARY OF THE INVENTION

In one aspect of the present invention, a method is provided for measuring insulating film thickness, such as the width of sidewall spacers. The method includes positioning a first test structure having a first resistance at a first location on a semiconductor wafer and positioning a second test structure having a second resistance different from the first resistance at a second location on the semiconductor wafer. The method also includes measuring the first resistance of the first test structure and measuring the second resistance of the second test structure. The method also includes determining an average characteristic of the first test structure and the second test structure, other than resistance, based on the first resistance of the first test structure and the second resistance of the second test structure.

In another aspect of the present invention, an apparatus is provided. The apparatus includes a semiconductor substrate, a first test structure integrated into the semiconductor substrate, and a second test structure integrated into the semiconductor substrate. The first test structure includes a first highly doped region, a first gate region and a second gate region separated by at least a portion of the first highly doped region, a first insulating layer adjacent to the first gate region towards the second gate region, and a second insulating layer adjacent to the second gate region towards the first gate region. The first insulating layer and the second insulating layer are separated by a first non-zero distance. The second test structure includes a second highly doped region, a third gate region and a fourth gate region separated by at least a portion of the second highly doped region, a third insulating layer adjacent to the third gate region towards the fourth gate region, and a fourth insulating layer adjacent to the fourth gate region towards the third gate region. The third insulating layer and the fourth insulating layer are separated by a second non-zero distance different from the first non-zero distance. The first test structure and the second test structure are configured for determination of the average thickness of insulating layers through measuring a first resistance between the first highly doped region and a first adjacent highly doped region that is also proximate with the first gate region and the second gate region and measuring a second resistance between the second highly doped region and a second adjacent highly doped region that is also proximate with the third gate region and the fourth gate region.

In still another aspect of the present invention, a system of automatic process control measuring insulating film thickness, such as the width of sidewall spacers, to monitor the process stream and possibly modify the process stream. The system includes a computer system, a manufacturing model coupled with the computer system, a machine interface coupled with the manufacturing model, a processing tool configured to process semiconductor wafers and coupled to receive at least one control input parameter signal from the machine interface, and a metrology tool coupled with the first processing tool and the second processing tool. The manufacturing model is configured to generate and modify at least one control input parameter. The machine interface is configured to receive process recipes from the manufacturing model. The metrology tool is configured to acquire metrology data. The metrology data includes a resistance from each test structure associated with a semiconductor wafer. The metrology tool is configured to provide the resistance to the computer system to determine an average characteristic of a parameter other than resistance of the semiconductor wafer.

BRIEF DESCRIPTION OF THE DRAWINGS

The invention may be understood by reference to the following description taken in conjunction with the accompanying drawings, in which like reference numerals identify like elements, and in which.

Figure 1:
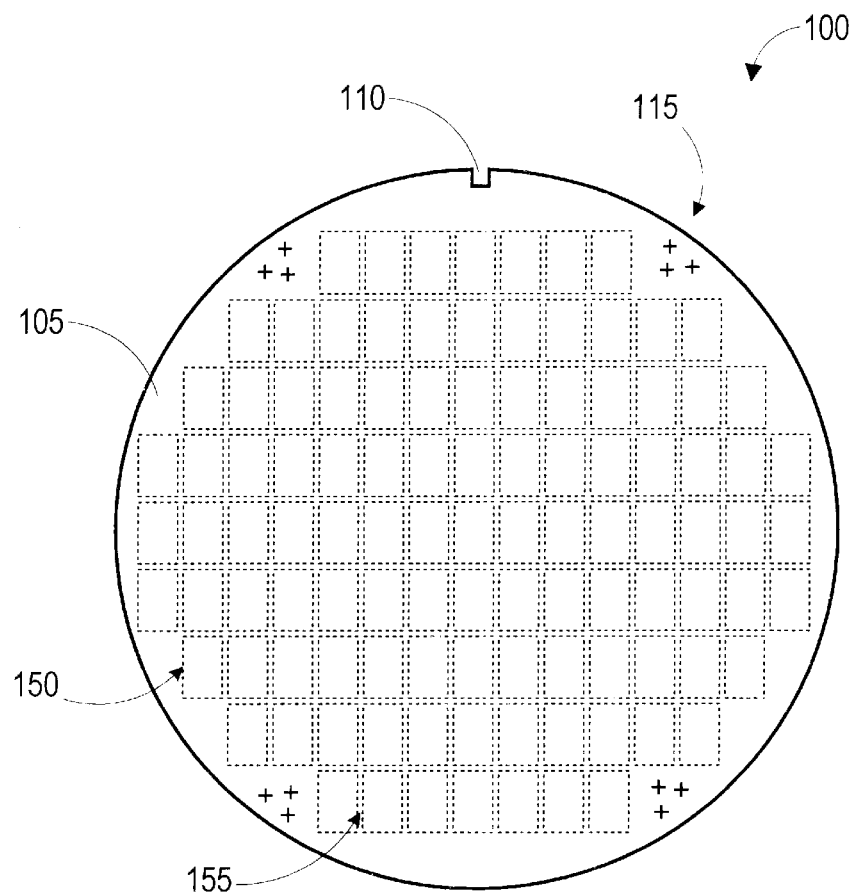
FIG. 1 is a simplified diagram of a prior art semiconductor wafer.
Figure 2A:
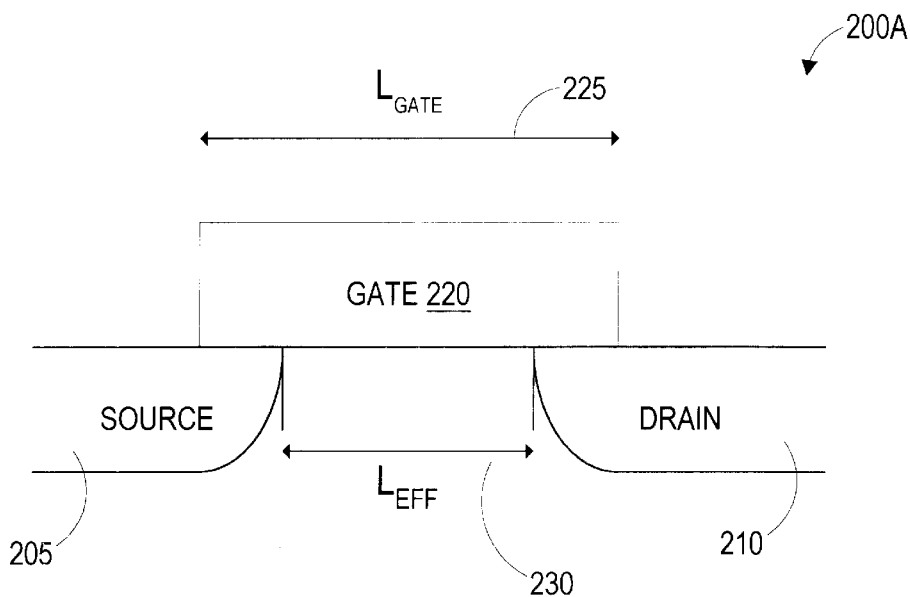
FIG. 2A is a prior art cross-section view of various features associated with the semiconductor wafer.
Figure 2B:
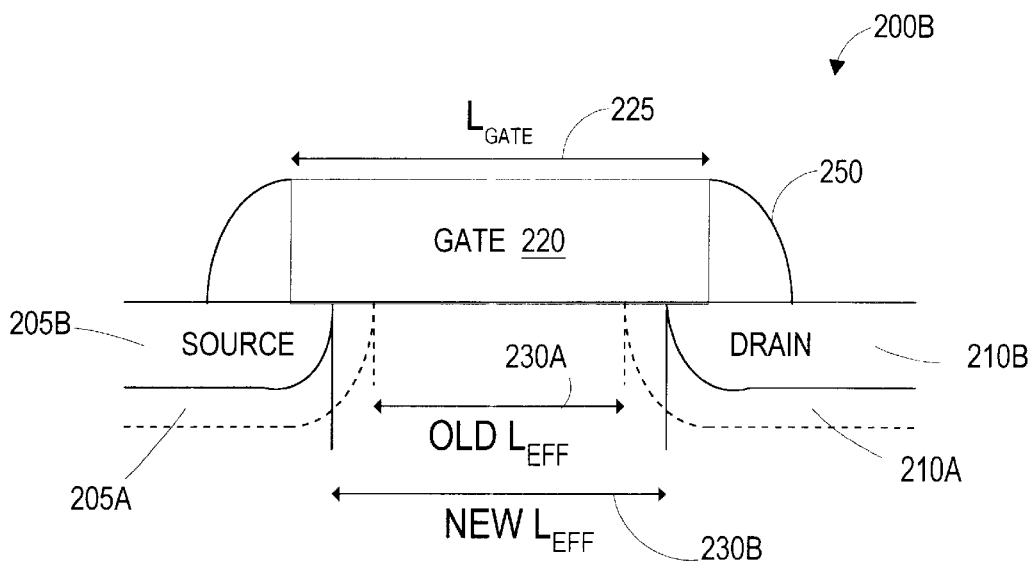
FIG. 2B is a prior art cross-section view of various features associated with the semiconductor wafer when using sidewall spacers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors. It should be appreciated that the drawings presented herein are not to scale, and the sizes of the various semiconductor features may be greatly exaggerated relative to other features.

Many discreet processes are involved in semiconductor manufacturing. Many times, semiconductor devices are stepped through multiple manufacturing process tools. Errors that can occur during the formation of structures on and in semiconductor wafers being processed can cause significant degradation of the wafers being manufactured. Embodiments of the present invention provide for electrically measuring the width of the sidewall spacers.

Figure 3A:
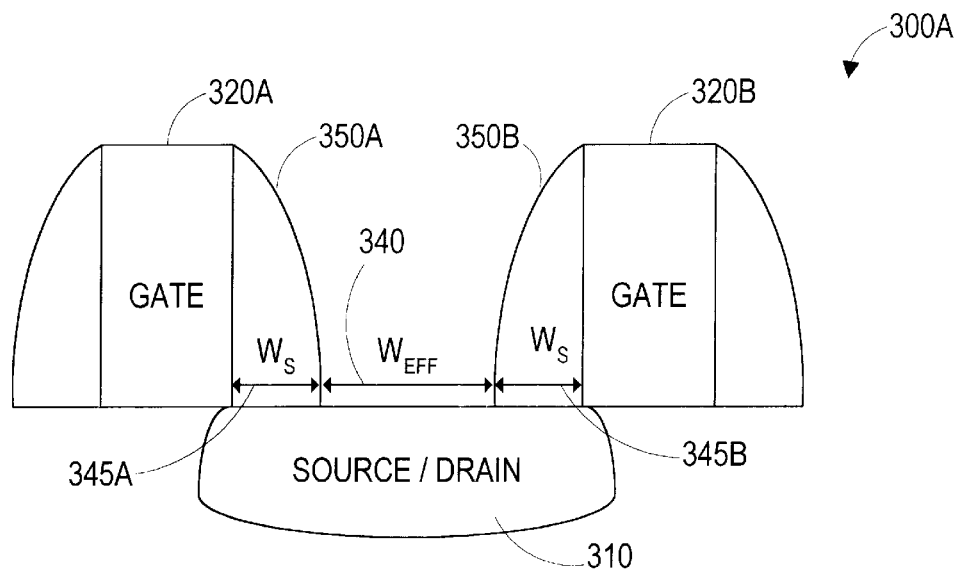
FIG. 3A is a side cross-section view of the various features including the sidewall spacers in accordance with one embodiment of the present invention.

Turning now to FIG. 3A, a side cross-section view of the various features of a test structure 300A including sidewall spacers 350 in accordance with one embodiment of the present invention is shown. The gate regions 320A and 320B each include sidewall spacers 350A and 350B, respectively. The source and drain regions 310 are viewed one in front of the other. The width of the sidewalls ($W_S$) 345A and 345B are shown with the effective width ($W_{EFF}$) between the sidewall spacers 345A and 345B.

Figure 3B:
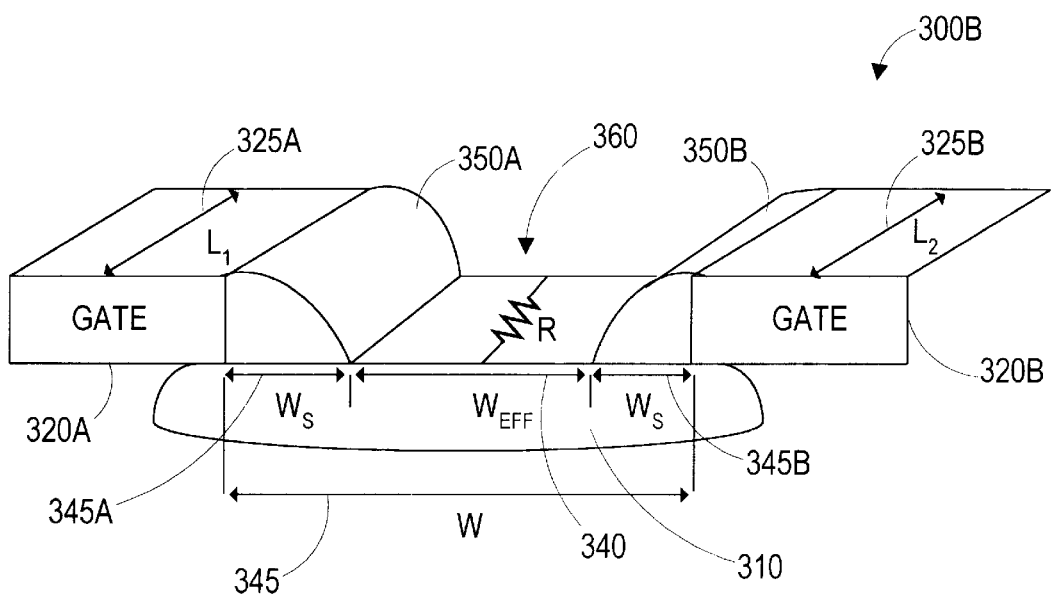
FIG. 3B is a three-dimensional side view of FIG. 3A, including the resistance in accordance with one embodiment of the present invention.

Turning now to FIG. 3B, a perspective view of a test structure 300B, including a resistance in accordance with one embodiment of the present invention, is illustrated. The gate regions 320A and 320B each include the sidewall spacers 350A and 350B, respectively. The source and drain regions 310 are viewed one in front of the other. The width of the sidewalls ($W_S$) 345A and 345B are shown with the effective width ($W_{EFF}$) between the sidewall spacers 345A and 345B. The total distance (W) between the gate regions 320A and 320B is also given. The total distance between the gate regions 320A and 320B is the sum of the width of the sidewalls 345A and 345B and the effective width between the sidewall spacers 345A and 345B.

$$W = W_{EFF} + W_S + W_S$$

Note that gate length ($L_1$) 325A for gate region 320A and gate length ($L_2$) 325B for gate region 320B are shown in FIG. 3B. The source-drain resistance (R) is shown as a resistor 360.

The resistance (R) may be calculated from the sheet resistance (ρ) of the semiconductor, the length (L) of the resistor, and the effective distance ($W_{EFF}$) 340 between the gate regions 320A and 320B. The sheet resistance is determined by the type of semiconductor and the doping used therein. The length of the resistor corresponds to the length of the respective gate region 320.

$$R = \rho L / W$$

It is also possible to measure the resistance (R) experimentally. By measuring the resistance of two different resistors ($R_1$) and ($R_2$) at different cites on the wafer 100, the width of the sidewalls ($W_S$) can be determined. For example, using an Hewlett-Packard (HP) 4156A parametric analyzer or similar product such as is now manufactured by Agilent Technologies, Inc. of Palo Alto, Calif. 94306, the resistance measurement may be performed during the manufacturing process without introducing an undue delay.

One of ordinary skill in the art having benefit of this disclosure will be able to implement various embodiments of the present invention in different ways. By way of example and not limitation, the following outline is provided as a guide to several embodiments. A process station or metrology station may be automated with the parametric analyzer mentioned above to measure several structures. Values for the structures, e.g., spacer widths, may then be extracted from these measurements as described herein. The spacer widths may then be compared to metrology data and values from previous runs on similar tools using similar process recipes. The process may then be adjusted accordingly. Possible adjustments include spacer film deposition time, spacer film thickness, spacer film temperature, spacer film etch time, power, etc.

For the following calculations, the following assumptions are made. The assumptions are not required in every implementation of the present invention, but are made for the purposes of this example. As uniformity in sidewall widths is desirable, the sidewall widths ($W_S$) are assumed to be substantially equal. The summed widths of the two sidewalls are referred to as ΔW.

$$\Delta W = W_S + W_S$$

The sheet resistance (ρ) is assumed to be a constant. The resistor lengths ($L_1$) and ($L_2$) are assumed to be substantially equal.

The equations for the two resistors are as follows:

$$R_1 = \frac{\rho L_1}{W_1 - \Delta W}$$

$$R_2 = \frac{\rho L_2}{W_2 - \Delta W}$$

By assuming that the sheet resistance and the lengths are constants, one can solve the two simultaneous equations for the non-zero constant (ρL).

$$\rho L = R_1(W_1 - \Delta W) = R_2(W_2 - \Delta W)$$

By assuring that $R_1$ and $R_2$ are different (so that $R_1 - R_2$ is non-zero), the sidewall widths (ΔW) are found by rearrangement. Here assume that $R_1 > R_2$.

$$\Delta W = \frac{R_1 W_1 - R_2 W_2}{R_1 - R_2}$$

Returning to the assumptions, note that the gate width is typically chosen at or near the minimum width for the technology of the scale used in the manufacturing process, whether that scale is 0.5 μm or 0.13 μm, etc. Tracking variations in the sidewall spacer widths becomes critical to predicting the performance of the manufacturing process as the size of scale technology decreases. For example, if the typical gate width were 0.05 μm, then the typical $W_2$ for a production semiconductor circuit would be 0.20–0.25 μm. For the test structures, $W_2$ values are contemplated from 1× up to 10× or 100× those sizes, or 0.20–20 μm.

Current technology uses optical measurement techniques for measuring the sidewall spacer widths. These optical measurement techniques have large errors (i.e. uncertainties), both in absolute terms and in relative terms. The use of the electrical method described herein may advantageously lead to smaller errors, leading to more accurate measurements and measurements that are more precise.

The test structure 300B includes at least a highly doped region, a first gate region and a second gate region separated by at least a portion of the highly doped region, a first insulating layer adjacent to the first gate region towards the second gate region, and a second insulating layer adjacent to the second gate region towards the first gate region. The first insulating layer and the second insulating layer are separated by a non-zero distance. For measuring an average characteristic, such as an insulating film thickness, two test structures 300B are required. The non-zero distance for each test structure 300B must be different. Using a first test structure 300B with a first non-zero distance with a pair of second test structures 300B each having a second non-zero distance different from the first non-zero distance allows for two independent estimates for the average characteristic.

Figure 4A:
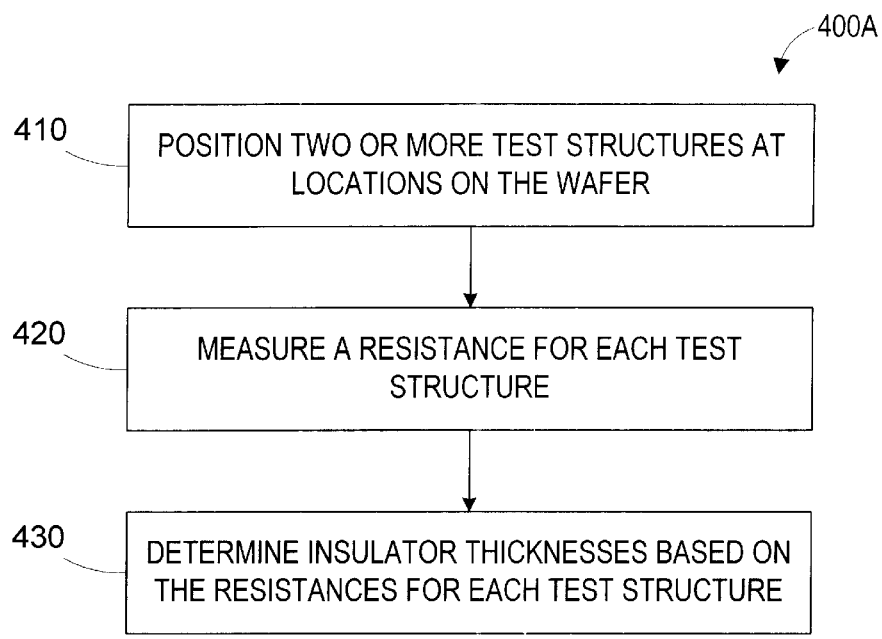
FIG. 4A illustrates one embodiment of a flowchart of a method for measuring insulator thickness in accordance with one embodiment of the present invention.

Turning now to FIG. 4A, a flowchart of an embodiment of a method 400A for measuring insulator thickness in accordance with one embodiment of the present invention is illustrated. The insulator thickness may be the sidewall spacer width. Two or more test structures are positioned at locations on the wafer 410. The method 400A measures a resistance for each test structure 420. The method determines the insulator thickness using the resistances for each test structure 430.

If two test structures are positioned in proximity, then an average sidewall spacer thickness may be determined using the formula given above directly. If three or more sidewall spacers are positioned in proximity, then two or more independent estimates of the sidewall spacer thickness may be determined by pairing the test structures and using the formula given above directly for each pair. Pairs in proximity provide estimates of the sidewall spacer thickness near the pairs.

If two test structures are placed distally, then the estimate for the average sidewall spacer thickness determined using the formula given above is across the span between the two test structures. More importantly, if two or more pairs of test structures are placed distally across the face of the wafer with each member of each pair proximate, then the estimate for the sidewall spacer width for each pair of test structures provides an indication of the uniformity of the sidewall spacer width across the face of the wafer. Using three test structures proximately leads to two independent determinations of the sidewall spacer width for each trio of test structures.

Figure 4B:
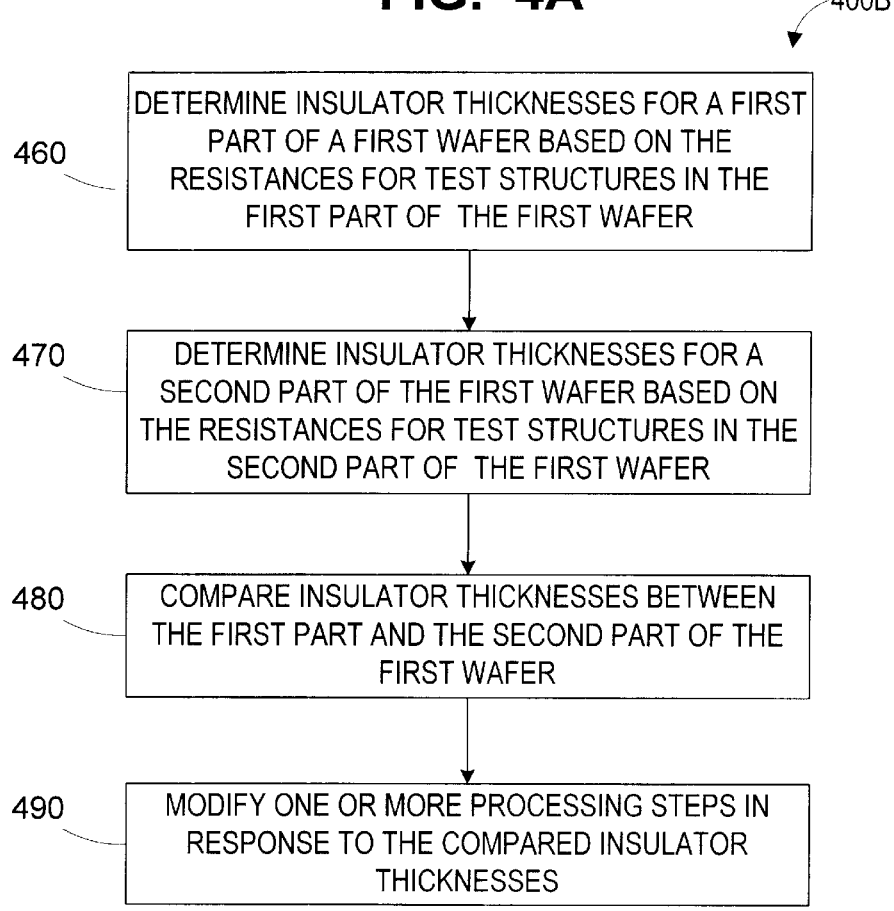
FIG. 4B illustrates one embodiment of a flowchart of a method for comparing insulator thickness between wafers in accordance with one embodiment of the present invention.

FIG. 4B illustrates a flowchart of one embodiment of a method 400B for comparing insulator thickness between different parts of a wafer in accordance with one embodiment of the present invention. The insulator thickness may be the sidewall spacer width. The method 400B determines the insulator thickness for a first part of the first wafer based on the resistances for two or more test structures in the first part of the first wafer 460. The method 400B also determines the insulator thickness for a second part of the first wafer based on the resistances for two or more test structures in the second part of the first wafer 470. The method 400B compares the insulator thicknesses between the first part and the second part of the first wafer 480. The method may also modify one or more processing steps 490 in response to the result of the comparison between the insulator thicknesses of the first wafer.

As an example, consider a production run of wafers manufactured with substantially identical settings. By using the method 400B illustrated in FIG. 4B, changes to the insulator thickness from wafer to wafer in the same run can be monitored. If changes in the insulator thickness is observed, then the manufacturing process can be modified to correct any observed problems. Each wafer may have two test structures on opposite sides of the wafer. An average insulator thickness may be determined for each wafer. Alternatively, two pairs of test structures may be placed on each wafer, on opposite sides of the wafer. Other alternatives include pairs, trios, etc. placed systematically (e.g., at predetermined locations) across the surface of the wafer. Changes across a wafer as well as from wafer to wafer can be monitored. Changes from run to run may also be monitored.

The principles taught by the present invention can be implemented in an Advanced Process Control (APC) Framework. The APC is a preferred platform from which to implement a control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Figure 5:
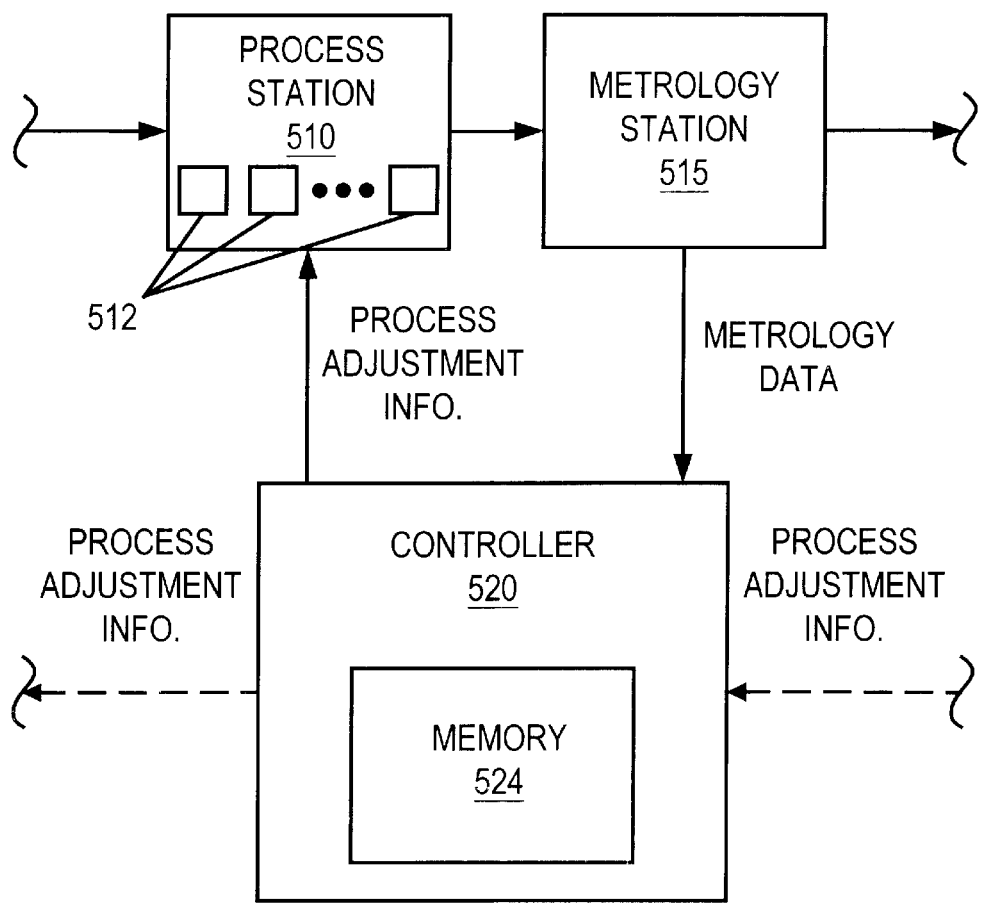
FIG. 5 is a diagram of one embodiment of a subset of a system implementing an automatic process control framework according to one aspect of the present invention.

FIG. 5 is a diagram of one embodiment of a subset of a system implementing the APC framework, including a wafer fabrication process station 510, and the corresponding metrology station 515, and controller 520. In the embodiment of FIG. 5, the wafer fabrication process station 510 includes one or more wafer fabrication tools 512 that perform the process. The controller 520 receives the metrology data from the metrology station 515, and may also receive process adjustment information and provide process adjustment information, for feedback purposes. The controller 520 includes a memory 524 for storing data, including measured, calculated, and "target" values of various parameters. In one embodiment, metrology lengths or thicknesses may be inferred from electrical measurements.

The metrology station 515 produces metrology data regarding the one or more predetermined parameters of the semiconductors wafers 100 affected by the preceding wafer fabrication processes in combination, and provides the metrology data to the controller 520.

The controller 520 accesses the target values of the predetermined parameters in the memory 524, compares the metrology data to the corresponding target values, and may generate one or more difference values reflecting differences between the metrology data and the corresponding target values. The controller 520 may use the one or more difference values to produce target value adjustment information for each of the wafer fabrication processes, represented here by the wafer fabrication process station 510. The target value adjustment information specifies adjustments to the target values of those controllers as required to achieve desired or "optimal" results of the wafer fabrication processes in combination. Across a wafer, parameters including but not limited to deposition temperature, etch power, and etch time may be adjusted. From wafer to wafer, parameter including but not limited to depostion time, depostion thickness, depostion temperature, etch power, etch time, and etch temperature may be adjusted.

It is noted that the controller 520 need not provide target value adjustment information to each and every one of the wafer fabrication process stations represented by the wafer fabrication process station 510. In other embodiments, the controller 520 may provide target value adjustment information to a subset of the other wafer fabrication process stations, or even to a single one of the other wafer fabrication process stations.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

Some aspects of the invention as disclosed above may be implemented in hardware or software. Thus, some portions of the detailed descriptions herein are consequently presented in terms of a hardware implemented process and some portions of the detailed descriptions herein are consequently presented in terms of a software-implemented process involving symbolic representations of operations on data bits within a memory of a computing system or computing device. These descriptions and representations are the means used by those in the art to convey most effectively the substance of their work to others skilled in the art using both hardware and software. The process and operation of both require physical manipulations of physical quantities. In software, usually, though not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated or otherwise as may be apparent, throughout the present disclosure, these descriptions refer to the action and processes of an electronic device, that manipulates and transforms data represented as physical (electronic, magnetic, or optical) quantities within some electronic device's storage into other data similarly represented as physical quantities within the storage, or in transmission or display devices. Exemplary of the terms denoting such a description are, without limitation, the terms "processing," "computing," "calculating," "determining," "displaying," and the like.

Note also that the software-implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

Figure 6:
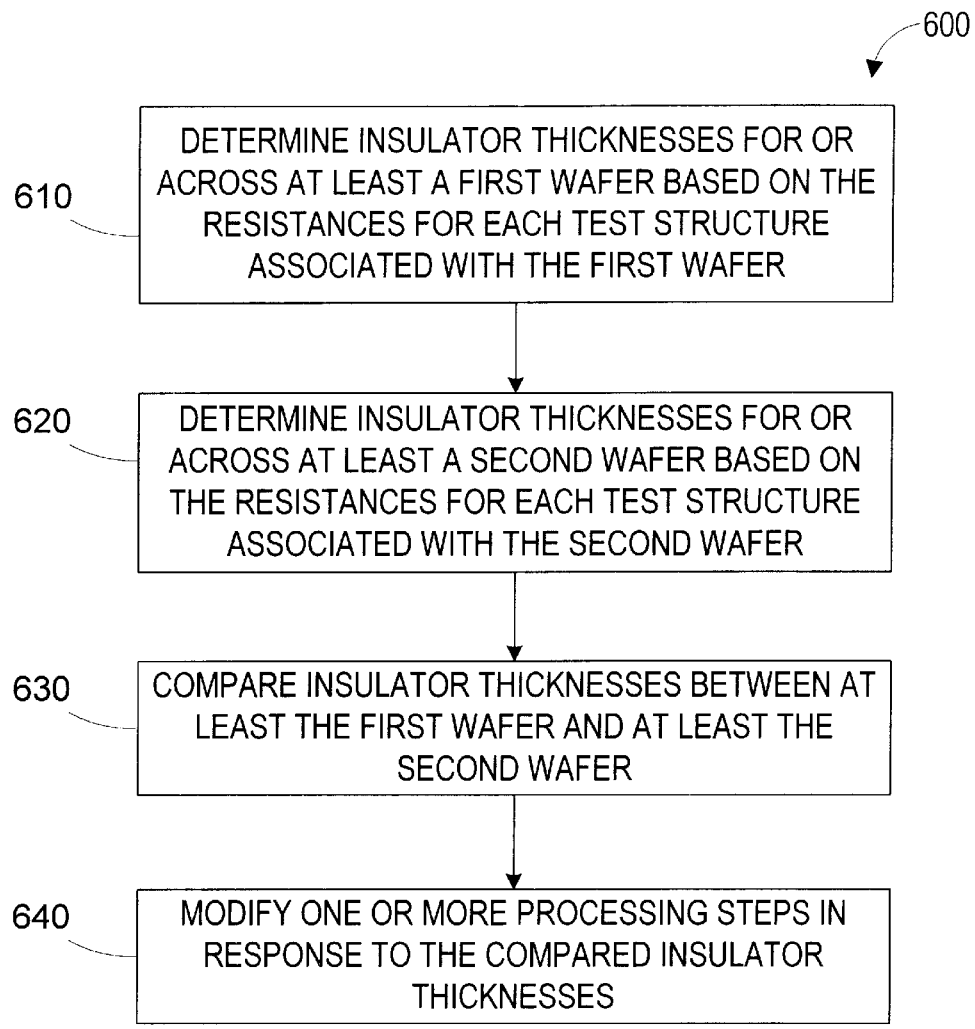
FIG. 6 is a flowchart of one embodiment of a method for comparing insulator thicknesses between two different wafers in accordance with one embodiment of the present invention.

Turning now to FIG. 6, a flowchart of one embodiment of a method 600 for comparing insulator thicknesses between two different wafers in accordance with one embodiment of the present invention is illustrated. The insulator thickness may be the sidewall spacer width. The method 600 determines the insulator thickness for a first wafer based on the resistances for two or more test structures on the first wafer 610. The method 600 also determines the insulator thickness for a second wafer based on the resistances for two or more test structures on the second wafer 620. The method 600 compares the insulator thicknesses between the first wafer and the second wafer 630. The method may also modify one or more processing steps 640 in response to the result of the comparison between the insulator thicknesses of the first wafer and the second wafer.

Note that the first wafer and the second wafer may be part of the same run or different runs. Thus, variations within a run and between runs are both determinable using different aspects of the present invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope set forth in the claims below.

What is claimed:

1. A method, comprising:

measuring a first resistance of a first region substantially between a first and a second insulating film on a semiconductor wafer;

measuring a second resistance, different from the first resistance, of a second region substantially between a third and a fourth insulating film on the semiconductor wafer; and determining an average characteristic of the first region and the second region, other than resistance, based on the first resistance of the first region and the second resistance of the second region.

2. The method of claim 1, wherein determining the average characteristic of the first region and the second region, other than resistance, based on the first resistance of the first region and the second resistance of the second region comprises determining an average thickness of the first, second, third, and fourth insulating films based on the first resistance and the second resistance.

3. The method of claim 2, wherein determining the average thickness of the first, second, third, and fourth insulating films based on the first resistance and the second resistance comprises determining an average sidewall spacer width of first, second, third, and fourth sidewall spacers, which are formed on respective first, second, third, and fourth gate structures, based on the first resistance and the second resistance.

4. The method of claim 3, wherein determining the average sidewall spacer width comprises determining the average sidewall spacer width using the following formula, where $\Delta W$ is the average sidewall spacer width, $R_1$ is the first resistance, $R_2$ is the second resistance, $W_1$ is a first distance between the first and second gate structures, and $W_2$ is a second distance between the third and fourth gate structures:

$$\Delta W = \frac{R_1 W_1 - R_2 W_2}{R_1 - R_2}.$$

5. The method of claim 1, further comprising
measuring a third resistance of a third region at a third location distal from the first region and the second region on the semiconductor wafer;
measuring a fourth resistance different from the third resistance of a fourth region at a fourth location near the third location on the semiconductor wafer;
determining an average characteristic of the third test structure and the fourth test structure, other than resistance, based on the third resistance of the third region and the fourth resistance of the fourth region.

6. The method of claim 5, further comprising
comparing the average characteristic of the first region and the second region to the average characteristic of the third region and the fourth region.

7. The method of claim 6, further comprising:
modifying one or more processing steps in response to comparing the average characteristic of the first region and the second region to the average characteristic of the third region and the fourth region.

8. The method of claim 1, further comprising:
positioning the first region having the first resistance at a first location on the semiconductor wafer; and
positioning the second region having the second resistance different from the first resistance at a second location on the semiconductor wafer.

9. The method of claim 8, wherein positioning the first region having the first resistance at a first location on the semiconductor wafer comprises positioning the first region in a larger semiconductor circuit on the semiconductor wafer.

10. The method of claim 8, wherein positioning the first region having the first resistance at the first location on the semiconductor wafer comprises positioning the first region separate from other semiconductor circuits on the semiconductor wafer.

11. The method of claim 10, wherein positioning the first region having the first resistance at the first location on the semiconductor wafer comprises positioning the first region in a scribe line.

12. The method of claim 10, wherein positioning the first region having the first resistance at the first location on the semiconductor wafer comprises positioning the first region between other semiconductor circuits on the semiconductor wafer.

13. The method of claim 10, wherein positioning the first region having the first resistance at the first location on the semiconductor wafer comprises positioning the first region near an outer edge of the surface of the semiconductor wafer.

14. The method of claim 8, wherein positioning the first region having the first resistance at the first location on the semiconductor wafer comprises positioning the first region having a first source-drain resistance at the first location on the semiconductor wafer.

15. The method of claim 14, wherein positioning the second region having the second resistance different from the first resistance at the second location on the semiconductor wafer comprises positioning the second test structure having a second source-drain resistance different from the first source-drain resistance at the second location on the semiconductor wafer.

16. The method of claim 15, wherein positioning the first region having the first source-drain resistance at the first location on the semiconductor wafer comprises positioning the first region having the first source-drain resistance and the first distance between the first and second gate structures at the first location on the semiconductor wafer; and wherein positioning the second region having the second source-drain resistance different from the first source-drain resistance at the second location on the semiconductor wafer comprises positioning the second region having the second source-drain resistance different from the first source-drain resistance and the second distance between the third and fourth gate structures at the second location on the semiconductor wafer.

17. The method of claim 8, further comprising:
positioning the third region having the third resistance at a third location distal from the first location and the second location on the semiconductor wafer; and
positioning the fourth region having the fourth resistance different from the third resistance at a fourth location near the third location on the semiconductor wafer.

18. The method of claim 17, wherein positioning the third region having the third resistance at the third location distal from the first location and the second location on the semiconductor wafer comprises positioning the third region in a scribe line.

19. A system, comprising:
a computer system;
a manufacturing model coupled with the computer system, the manufacturing model being configured to generate and modify at least one control input parameter;
a machine interface coupled with the manufacturing model, the machine interface being configured to receive process recipes from the manufacturing model;
a processing tool configured to process semiconductor wafers and coupled to receive at least one control input parameter signal from the machine interface; and
a metrology tool coupled with the first processing tool and the second processing tool, the metrology tool configured to acquire metrology data, wherein the metrology data include a resistance from at least one test region substantially between at least one pair of insulating films associated with a semiconductor wafer, wherein the metrology tool is configured to provide the resistance to the computer system to determine an average characteristic of a parameter other than resistance of the semiconductor wafer.

20. The system of claim 19, wherein the average characteristic comprises an average insulating film thickness.

21. The system of claim 20, wherein the average insulating film thickness comprises an average sidewall spacer thickness.

22. A computer readable medium encoded with instructions that, when executed by a computer, performs a method, comprising:
measuring a first resistance of a first region substantially between a first and a second insulating film on a semiconductor wafer;
measuring a second resistance, different from the first resistance, of a second region substantially between a third and a fourth insulating film on the semiconductor wafer; and
determining an average characteristic of the first region and the second region, other than resistance, based on the first resistance of the first region and the second resistance of the second region.

23. The computer readable medium encoded with instructions that, when executed by the computer, performs the method of claim 22, wherein determining the average characteristic of the first region and the second region, other than resistance, based on the first resistance of the first region and the second resistance of the second region comprises determining an average thickness of the first, second, third, and fourth insulating films based on the first resistance and the second resistance.

24. The computer readable medium encoded with instructions that, when executed by the computer, performs the method of claim 23, wherein determining the average thickness of the first, second, third, and fourth insulating films based on the first resistance and the second resistance comprises determining an average sidewall spacer width of first, second, third, and fourth sidewall spacers, which are formed on respective first, second, third, and fourth gate structures, based on the first resistance and the second resistance.

25. The method of claim 24, wherein determining the average sidewall spacer width comprises determining the average sidewall spacer width using the following formula, where $\Delta W$ is the average sidewall spacer width, $R_1$ is the first resistance, $R_2$ is the second resistance, $W_1$ is a first distance between the first and second gate structures, and $W_2$ is a second distance between the third and fourth gate structures:

$$\Delta W = \frac{R_1 W_1 - R_2 W_2}{R_1 - R_2}.$$

26. The computer readable medium encoded with instructions that, when executed by the computer, performs the method of claim 22, further comprising
measuring a third resistance of a third region at a third location distal from the first region and the second region on the semiconductor wafer;
measuring a fourth resistance different from the third resistance of a fourth region at a fourth location near the third location on the semiconductor wafer;
determining an average characteristic of the third test structure and the fourth test structure, other than resistance, based on the third resistance of the third region and the fourth resistance of the fourth region.

27. The computer readable medium encoded with instructions that, when executed by the computer, performs the method of claim 26, further comprising
comparing the average characteristic of the first region and the second region to the average characteristic of the third region and the fourth region.

28. The computer readable medium encoded with instructions that, when executed by the computer, performs the method of claim 27, further comprising:
modifying one or more processing steps in response to comparing the average characteristic of the first region and the second region to the average characteristic of the third region and the fourth region.

29. The computer readable medium encoded with instructions that, when executed by the computer, performs the method of claim 22, further comprising:
positioning the first region having the first resistance at a first location on the semiconductor wafer; and
positioning the second region having the second resistance different from the first resistance at a second location on the semiconductor wafer.

30. The computer readable medium encoded with instructions that, when executed by the computer, performs the method of claim 29, wherein positioning the first region having the first resistance at a first location on the semiconductor wafer comprises positioning the first region in a larger semiconductor circuit on the semiconductor wafer.

31. The computer readable medium encoded with instructions that, when executed by the computer, performs the method of claim 29, wherein positioning the first region having the first resistance at the first location on the semiconductor wafer comprises positioning the first region separate from other semiconductor circuits on the semiconductor wafer.

32. The computer readable medium encoded with instructions that, when executed by the computer, performs the method of claim 31, wherein positioning the first region having the first resistance at the first location on the semiconductor wafer comprises positioning the first region in a scribe line.

33. The computer readable medium encoded with instructions that, when executed by the computer, performs the method of claim 31, wherein positioning the first region having the first resistance at the first location on the semiconductor wafer comprises positioning the first region between other semiconductor circuits on the semiconductor wafer.

34. The computer readable medium encoded with instructions that, when executed by the computer, performs the method of claim 31, wherein positioning the first region having the first resistance at the first location on the semiconductor wafer comprises positioning the first region near an outer edge of the surface of the semiconductor wafer.

35. The computer readable medium encoded with instructions that, when executed by the computer, performs the method of claim 29, wherein positioning the first region having the first resistance at the first location on the semiconductor wafer comprises positioning the first region having a first source-drain resistance at the first location on the semiconductor wafer.

36. The computer readable medium encoded with instructions that, when executed by the computer, performs the method of claim 35, wherein positioning the second region having the second resistance different from the first resistance at the second location on the semiconductor wafer comprises positioning the second test structure having a second source-drain resistance different from the first source-drain resistance at the second location on the semiconductor wafer.

37. The computer readable medium encoded with instructions that, when executed by the computer, performs the method of claim 36, wherein positioning the first region having the first source-drain resistance at the first location on the semiconductor wafer comprises positioning the first region having the first source-drain resistance and the first distance between the first and second gate structures at the first location on the semiconductor wafer; and wherein positioning the second region having the second source-drain resistance different from the first source-drain resistance at the second location on the semiconductor wafer comprises positioning the second region having the second source-drain resistance different from the first source-drain resistance and the second distance between the third and fourth gate structures at the second location on the semiconductor wafer.

38. The computer readable medium encoded with instructions that, when executed by the computer, performs the method of claim 29, further comprising:
positioning the third region having the third resistance at a third location distal from the first location and the second location on the semiconductor wafer; and positioning the fourth region having the fourth resistance different from the third resistance at a fourth location near the third location on the semiconductor wafer.

39. The computer readable medium encoded with instructions that, when executed by the computer, performs the method of claim 38, wherein positioning the third region having the third resistance at the third location distal from the first location and the second location on the semiconductor wafer comprises positioning the third region in a scribe line.

40. The computer readable medium encoded with instructions that, when executed by the computer, performs the method of claim 22, wherein the medium is a storage medium.

41. The computer readable medium encoded with instructions that, when executed by the computer, performs the method of claim 22, wherein the medium is a transmission medium.

42. A system, comprising:

means for measuring a first resistance of a first region substantially between a first and a second insulating film at a first location on a semiconductor wafer;

means for measuring a second resistance, different from the first resistance, of a second region substantially between a third and a fourth insulating film at a second location on the semiconductor wafer; and means for determining an average characteristic of the first region and the second region, other than resistance, based on the first resistance of the first region and the second resistance of the second region.

43. The system of claim 42, wherein the means for determining the average characteristic of the first region and the second region, other than resistance, based on the first resistance and the second resistance comprise means for determining an average insulating film thickness of the first, second, third and fourth insulating films based on the first resistance and the second resistance.

44. The system of claim 43, wherein the means for determining an average insulating film thickness of the first, second, third and fourth insulating films based on the first resistance and the second resistance comprise means for determining an average sidewall spacer width of first, second, third and fourth sidewall spacers based on the first resistance and the second resistance.

45. The system of claim 44, wherein the means for determining the average sidewall spacer width of the first, second, third and fourth sidewall spacers based on the first resistance and the second resistance comprise means for determining the average sidewall spacer width using the following formula, where $\Delta W$ is the average sidewall spacer width, $R_1$ is the first resistance, $R_2$ is the second resistance, $W_1$ is a first distance between first and second gate structures adjacent the first and second sidewall spacers, respectively, and $W_2$ is a second distance between third and fourth gate structures adjacent the third and fourth sidewall spacers, respectively:

$$\Delta W = \frac{R_1 W_1 - R_2 W_2}{R_1 - R_2}.$$

46. The system of claim 42, further comprising means for measuring a third resistance of a third region at a third location distal from the first location and the second location on a semiconductor wafer;

means for measuring a fourth resistance different from the third resistance of a fourth region at a fourth location near the third location on the semiconductor wafer;

means for determining an average characteristic of the third region and the fourth region, other than resistance, based on the third resistance [of the third test structure] and the fourth resistance.

47. The system of claim 46, further comprising means for comparing the average characteristic of the first region and the second region to the average characteristic of the third region and the fourth region.

48. The system of claim 47, further comprising:

means for modifying one or more processing steps in response to comparing the average characteristic of the first region and the second region to the average characteristic of the third region and the fourth region.

49. The system of claim 46, further comprising:

means for positioning the third region having the third resistance at the third location distal from the first location and the second location on the semiconductor wafer; and means for positioning the fourth region having the fourth resistance different from the third resistance at the fourth location near the third location on the semiconductor wafer.

50. The system of claim 42, further comprising:

means for positioning the first region having the first resistance at the first location on the semiconductor wafer; and means for positioning the second region having the second resistance different from the first resistance at the second location on the semiconductor wafer.

51. A method, comprising:

measuring a resistance of each region of one or more pairs of regions on a first semiconductor wafer, wherein each region on the first semiconductor wafer is substantially between a corresponding pair of insulating films;

determining an average characteristic, other than resistance, of each of the one or more pairs of regions from the resistance of each region of the one or more pairs of regions on the first semiconductor wafer;

measuring a resistance of each region of one or more pairs of regions on a second semiconductor wafer, wherein each region on the second semiconductor wafer is substantially between a corresponding pair of insulating films;

determining an average characteristic, other than resistance, of each of the one or more pairs of regions from the resistance of each region of the one or more pairs of regions on the second semiconductor wafer; and comparing the average characteristic from the first semiconductor wafer with the average characteristic from the second semiconductor wafer.

52. The method of claim 51, wherein determining an average characteristic of each of the one or more pairs, other than resistance, from the resistance of each region of the one or more pairs of regions on the first semiconductor wafer comprises determining an average insulating film thickness of each of the corresponding pairs of insulating films on the first semiconductor wafer from the resistance of each region of the one or more pairs of regions on the first semiconductor wafer.

53. The method of claim 52, wherein determining the average insulating film thickness of each of the corresponding pairs of insulating films on the first semiconductor wafer from the resistance of each region of the one or more pairs of regions on the first semiconductor wafer comprises determining an average sidewall spacer thickness of each of each of the corresponding pairs of insulating films on the first semiconductor wafer from the resistance of each region of the one or more pairs of regions on the first semiconductor wafer.

54. The method of claim further comprising:

modifying one or more processing steps in response to comparing the average characteristic from the first semiconductor wafer with the average characteristic from the second semiconductor wafer.

55. The method of claim 51, wherein measuring a resistance of each region of one or more pairs of regions on a second semiconductor wafer comprises measuring the resistance of each region of the one or more pairs of regions on the second semiconductor wafer comprised in a same run with the first semiconductor wafer; and wherein determining an average characteristic, other than resistance, of each of the one or more pairs of regions from the resistance of each region of the one or more pairs of regions on the second semiconductor wafer comprises determining the average characteristic, other than resistance, of each of the one or more pairs of regions from the resistance of each region of the one or more pairs of regions on the second semiconductor wafer comprised in the same run with the first semiconductor wafer.

56. The method of claim 51, wherein measuring a resistance of each region of one or more pairs of regions on a second semiconductor wafer comprises measuring the resistance of each region of the one or more pairs of regions on the second semiconductor wafer not comprised in a same run with the first semiconductor wafer; and wherein determining an average characteristic, other than resistance, of each of the one or more pairs of regions from the resistance of each region of the one or more pairs of regions on the second semiconductor wafer comprises determining the average characteristic, other than resistance, of each of the one or more pairs of regions from the resistance of each region of the one or more pairs of regions on the second semiconductor wafer not comprised in the same run with the first semiconductor wafer.

57. A computer readable medium encoded with instructions that, when executed by a computer, performs a method, comprising:

measuring a resistance of each region of one or more pairs of regions on a first semiconductor wafer, wherein each region on the first semiconductor wafer is substantially between a corresponding pair of insulating films;

determining an average characteristic, other than resistance, of each of the one or more pairs of regions from the resistance of each region of the one or more pairs of regions on the first semiconductor wafer;

measuring a resistance of each region of one or more pairs of regions on a second semiconductor wafer, wherein each region on the second semiconductor wafer is substantially between a corresponding pair of insulating films;

determining an average characteristic, other than resistance, of each of the one or more pairs of regions from the resistance of each region of the one or more pairs of regions on the second semiconductor wafer; and comparing the average characteristic from the first semiconductor wafer with the average characteristic from the second semiconductor wafer.

58. The computer readable medium encoded with instructions that, when executed by the computer, performs the method of claim 57, wherein determining an average characteristic of each of the one or more pairs, other than resistance, from the resistance of each region of the one or more pairs of regions on the first semiconductor wafer comprises determining an average insulating film thickness of each of the corresponding pairs of insulating films on the first semiconductor wafer from the resistance of each region of the one or more pairs of regions on the first semiconductor wafer.

59. The computer readable medium encoded with instructions that, when executed by the computer, performs the method of claim 58, wherein determining the average insulating film thickness of each of the corresponding pairs of insulating films on the first semiconductor wafer from the resistance of each region of the one or more pairs of regions on the first semiconductor wafer comprises determining an average sidewall spacer thickness of each of each of the corresponding pairs of insulating films on the first semiconductor wafer from the resistance of each region of the one or more pairs of regions on the first semiconductor wafer.

60. The computer readable medium encoded with instructions that, when executed by the computer, performs the method of claim 57, further comprising:

modifying one or more processing steps in response to comparing the average characteristic from the first semiconductor wafer with the average characteristic from the second semiconductor wafer.

61. The computer readable medium encoded with instructions that, when executed by the computer, performs the method of claim 57, wherein measuring a resistance of each region of one or more pairs of regions on a second semiconductor wafer comprises measuring the resistance of each region of the one or more pairs of regions on the second semiconductor wafer comprised in a same run with the first semiconductor wafer; and wherein determining an average characteristic, other than resistance, of each of the one or more pairs of regions from the resistance of each region of the one or more pairs of regions on the second semiconductor wafer comprises determining the average characteristic, other than resistance, of each of the one or more pairs of regions from the resistance of each region of the one or more pairs of regions on the second semiconductor wafer comprised in the same run with the first semiconductor wafer.

62. The computer readable medium encoded with instructions that, when executed by the computer, performs the method of claim 57, wherein measuring a resistance of each region of one or more pairs of regions on a second semiconductor wafer comprises measuring the resistance of each region of the one or more pairs of regions on the second semiconductor wafer not comprised in a same run with the first semiconductor wafer; and wherein determining an average characteristic, other than resistance, of each of the one or more pairs of regions from the resistance of each region of the one or more pairs of regions on the second semiconductor wafer comprises determining the average characteristic, other than resistance, of each of the one or more pairs of regions from the resistance of each region of the one or more pairs of regions on the second semiconductor wafer not comprised in the same run with the first semiconductor wafer.

63. A system, comprising:

means for measuring a resistance of each region of one or more pairs of regions on a first semiconductor wafer, wherein each region on the first semiconductor wafer is substantially between a corresponding pair of insulating films;

means for determining an average characteristic, other than resistance, of each of the one or more pairs of regions from the resistance of each region of the one or more pairs of regions on the first semiconductor wafer;

means for measuring a resistance of each region of one or more pairs of regions on a second semiconductor wafer, wherein each region on the second semiconductor wafer is substantially between a corresponding pair of insulating films;

means for determining an average characteristic, other than resistance, of each of the one or more pairs of regions from the resistance of each region of the one or more pairs of regions on the second semiconductor wafer; and means for comparing the average characteristic from the first semiconductor wafer with the average characteristic from the second semiconductor wafer.

64. The system of claim 63, wherein the means for determining an average characteristic of each of the one or more pairs, other than resistance, from the resistance of each region of the one or more pairs of regions on the first semiconductor wafer comprises means for determining an average insulating film thickness of each of the corresponding pairs of insulating films on the first semiconductor wafer from the resistance of each region of the one or more pairs of regions on the first semiconductor wafer.

65. The system of claim 64, wherein the means for determining the average insulating film thickness of each of the corresponding pairs of insulating films on the first semiconductor wafer from the resistance of each region of the one or more pairs of regions on the first semiconductor wafer comprises means for determining an average sidewall spacer thickness of each of each of the corresponding pairs of insulating films on the first semiconductor wafer from the resistance of each region of the one or more pairs of regions on the first semiconductor wafer.

66. The system of claim 63, further comprising:

means for modifying one or more processing steps in response to the means for comparing the average characteristic from the first semiconductor wafer with the average characteristic from the second semiconductor wafer.

67. The system of claim 63, wherein the means for measuring a resistance of each region of one or more pairs of regions on a second semiconductor wafer comprise means for measuring the resistance of each region of the one or more pairs of regions on the second semiconductor wafer comprised in a same run with the first semiconductor wafer; and wherein the means for determining an average characteristic, other than resistance, of each of the one or more pairs of regions from the resistance of each region of the one or more pairs of regions on the second semiconductor wafer comprise means for determining the average characteristic, other than resistance, of each of the one or more pairs of regions from the resistance of each region of the one or more pairs of regions on the second semiconductor wafer comprised in the same run with the first semiconductor wafer.

68. The system of claim 63, wherein the means for measuring the resistance of each region of one or more pairs of regions on a second semiconductor wafer comprise means for measuring the resistance of each region of the one or more pairs of regions on the second semiconductor wafer not comprised in a same run with the first semiconductor wafer; and wherein determining an average characteristic, other than resistance, of each of the one or more pairs of regions from the resistance of each region of the one or more pairs of regions on the second semiconductor wafer comprises determining the average characteristic, other than resistance, of each of the one or more pairs of regions from the resistance of each region of the one or more pairs of regions on the second semiconductor wafer not comprised in the same run with the first semiconductor wafer.

* * * * *